(12) United States Patent
Miki et al.

(10) Patent No.: US 9,773,703 B2
(45) Date of Patent: Sep. 26, 2017

(54) METHOD OF MANUFACTURING SEMICONDUCTOR DEVICE

(71) Applicant: Mitsubishi Electric Corporation, Tokyo (JP)

(72) Inventors: Kohei Miki, Tokyo (JP); Kazuyuki Onoe, Tokyo (JP); Shinichi Miyakuni, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/338,775

(22) Filed: Oct. 31, 2016

(65) Prior Publication Data

US 2017/0162439 A1    Jun. 8, 2017

(30) Foreign Application Priority Data

Dec. 3, 2015  (JP) ................. 2015-236851

(51) Int. Cl.
| H01L 21/00 | (2006.01) |
| H01L 21/768 | (2006.01) |
| H01L 21/04 | (2006.01) |
| H01L 21/027 | (2006.01) |
| H01L 21/683 | (2006.01) |

(52) U.S. Cl.
CPC .... *H01L 21/76898* (2013.01); *H01L 21/0274* (2013.01); *H01L 21/0475* (2013.01); *H01L 21/6836* (2013.01); *H01L 2221/68372* (2013.01); *H01L 2221/68381* (2013.01)

(58) Field of Classification Search
None
See application file for complete search history.

(56) References Cited

U.S. PATENT DOCUMENTS 4,871,630 A * 10/1989 Giammarco ........ H01L 21/0337
                                                          216/46
2003/0182790 A1* 10/2003 Hsiao ..................... B82Y 10/00
                                                          29/603.15
(Continued)

FOREIGN PATENT DOCUMENTS

| JP | Sho63-276228 A | 11/1988 |
| JP | Hei03-064758 A | 3/1991 |
| JP | Hei08-316210 A | 11/1996 |

(Continued)

OTHER PUBLICATIONS

D.W. Kim, et al. (2004) "Magnetically Enhanced Inductively Coupled Plasma Etching of 6H-SiC" IEEE Transactions on Plasma Science, vol. 32, No. 3, pp. 1362-1366.

*Primary Examiner* — Reema Patel
(74) *Attorney, Agent, or Firm* — Studebaker & Brackett PC

(57) ABSTRACT

A method of manufacturing a semiconductor device includes: forming a resist separation layer on a first main surface of a SiC substrate; applying a resist retaining a shape at a temperature of 200° C. or higher on the resist separation layer; patterning the resist by photolithography; heating a stage an which the SiC substrate is placed to a temperature of 200° C. or higher by a temperature control function, and dry-etching the SiC substrate by using the patterned resist as a mask to form a via hole; and after forming the via hole, removing the resist separation layer to separate the resist from the SiC substrate.

17 Claims, 4 Drawing Sheets

(56) References Cited

U.S. PATENT DOCUMENTS

| | | | |
|---|---|---|---|
| 2006/0063351 A1* | 3/2006 | Jain | G02F 1/1362 438/455 |
| 2007/0082427 A1* | 4/2007 | Shirahama | H01L 21/6835 438/105 |

FOREIGN PATENT DOCUMENTS

| | | |
|---|---|---|
| JP | Hei11-111695 A | 4/1999 |
| JP | 2005-535117 A | 11/2005 |
| JP | 2009-076786 A | 4/2009 |
| JP | 2011-192836 A | 9/2011 |
| JP | 2012-054616 A | 3/2012 |
| WO | 2004-012221 A2 | 2/2004 |

* cited by examiner

METHOD OF MANUFACTURING SEMICONDUCTOR DEVICE

BACKGROUND OF THE INVENTION

Field

The present invention relates to a method of manufacturing a semiconductor device.

Background

To secure a certain radiofrequency characteristic of a compound semiconductor device, a so-called via hole structure which provides a conduction path from a back surface of a substrate to a source electrode on a front surface of the substrate is formed by dry etching. This via hole forming is performed ordinarily by attaching a work substrate on a support substrate with an adhesive easily soluble in a chemical solution and capable of attachment and separation even at a temperature of about 150° C. In the case of GaN-on-SiC, rather than a resist mask, a metal mask more difficult to etch than SiC is ordinarily used because of the difficult-to-etch characteristic of the SiC substrate for example, IEEE TRANSACTIONS ON PLASMA SCIENCE, VOL. 32, No. 3, JUNE 2004).

In a case where a via hole is formed in a compound semiconductor device, such as CaN-on-SiC using SiC which is a difficult-to-etch material for a substrate, securing processability equivalent to that of GaAs requires a high-temperature process in which the temperature of a wafer stage on which a wafer is placed when processed is set to a temperature of 200° C. or higher by a temperature control function for the purpose of improving reactivity. However, there are presently no materials satisfying the requirements, such as a resist capable of retaining a shape even at a high temperature of 200° C. or higher and capable of being easily separated or dissolved and a wax (adhesive) not dissolved at a temperature of 150° C. or higher. For this reason, a low-temperature process of about 20° C., equivalent to that for GaAs, is necessarily used for forming a via hole in SiC.

It may be thought that the problem with a wax adhesive can be solved if direct transport is performed without using a support substrate. However, there is a need to apply a surface protective agent to protect the surface. Considering removing a surface protective agent afterward, a surface protective agent having heat resistance at about 150° C. at the highest is used. Therefore the problem with a low-temperature process cannot be avoided. This means that the processing time is increased due to a low processing rate, and that a metal mask is eventually used since any resist cannot endure processing for a long time period.

The metal mask generates a large amount of contamination, causes falls of debris from a ceiling plate onto the wafer and chamber walls, and causes a reduction in productivity, a reduction in yield and an increase in frequency of maintenance. As a solution to this problem, a method of limiting attachment of debris to a ceiling plate and chamber walls by providing a special electrode or structure (see, for example, JP 2005-535117 A and JP 8-316210A) and a method of limiting attachment by changing the plasma mode (see, for example, JP 2009-76786 A) have been disclosed.

Each of the above-described methods, however, requires extensively modifying the conventional apparatus and is incapable of radically inhibiting generation of nonvolatile products which cause falls of debris.

SUMMARY

In view of the above-described problem, an object of the present invention is to provide a method of manufacturing a semiconductor device capable of preventing a reduction in yield and an increase in frequency of maintenance and increasing the productivity while using the conventional apparatus without being specially modified.

According to the present invention, a method of manufacturing a semiconductor device includes: forming a resist separation layer on a first main surface of a SiC substrate; applying a resist retaining a shape at a temperature of 200° C. or higher on the resist separation layer; patterning the resist by photolithography; heating a stage on which the SiC substrate is placed to a temperature of 200° C. or higher by a temperature control function, and dry-etching the SiC substrate by using the patterned resist as a mask to form a via hole; and after forming the via hole, removing the resist separation layer to separate the resist from the SiC substrate.

In the present invention, the SiC substrate, which is a material difficult to etch, is dry-etched by using the resist as a mask instead of using a metal mask which becomes a cause of falls of debris by attaching to a ceiling plate without evaporating at the time of etching. A reduction in yield and an increase in frequency of maintenance caused by falls of debris can thereby be prevented. Since the resist is applied on the resist separation layer, even the resist difficult to separate and dissolve in an ordinary situation can be separated from the SiC substrate 1 by removing the resist separation layer. Dry etching can therefore be performed at a high temperature of 200° C. or higher by using as a mask the resist capable of retaining a shape at a temperature of 200° C. or higher. The processing rate is improved thereby, thus improving the productivity. Also, a conventional manufacturing apparatus can be used without being specially modified.

Other and further objects, features and advantages of the invention will appear fully from the following description.

DESCRIPTION OF EMBODIMENTS

A method of manufacturing a semiconductor device according to the embodiments of the present invention will be described with reference to the drawings, The same components will be denoted by the same symbols, and the repeated description thereof may be omitted.

First Embodiment

Figure 1:
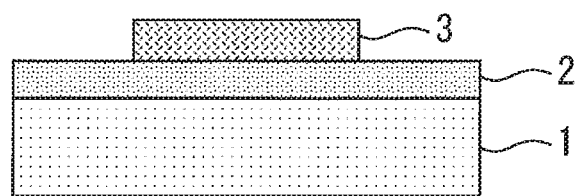
FIGS. 1 to 5 are sectional views showing a method of manufacturing a semiconductor device according to a first embodiment of the present invention.

FIGS. 1 to 5 are sectional views showing a method of manufacturing a semiconductor device according to a first embodiment of the present invention. First, as shown in FIG. 1, a GaN-on-SiC substrate is formed by epitaxially growing a GaN epi-layer 2 on a front surface of an SiC substrate 1. A source electrode 3 is formed on the GaN epi-layer 2.

Figure 2:
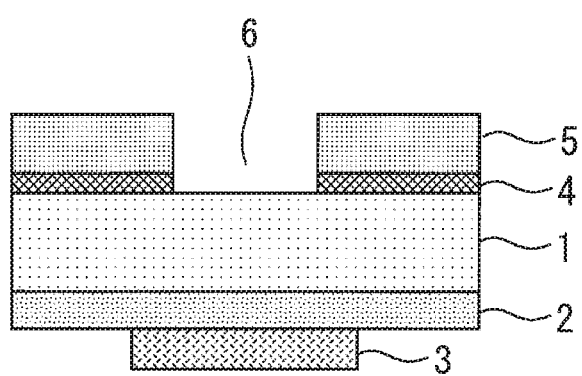

Subsequently, as shown in FIG. 2, a resist separation layer 4, which is not cured and soluble in a chemical solution even at a high temperature of 400° C., is applied to a back surface of the SiC substrate 1. The material of the resist separation layer 4 is, for example, Omnicoat, which is an aliphatic polyimide-based resist developed as the material of a sacrificial layer for a permanent resist.

Subsequently, a resist 5 having high dry resist resistance and capable of retaining a shape in a temperature range from 200° C. to about 400° C. and having a thickness (ordinarily 100 µm to 200 µm) equal to or larger than a work substrate thickness of the SiC substrate 1 is applied on the resist separation layer 4. Because there is a need to satisfy a requirement that the resist 5 can endure a high temperature, the resist 5 is an epoxy permanent resist capable of retaining a shape at a temperature of 200° C. or higher, e.g., an epoxy negative resist such as SU-8, Su8_3000, KI-1000 or TMMR-S2000. As a method for application of these layers, a spin coating is ordinarily used. However, any of this and other application methods including spray coating or dry film attachment is not exclusively used.

Subsequently, the resist separation layer 4 and the resist 5 are patterned by photolithography, and an opening 6 is formed. Further, hard baking is performed to prevent pattern breakage of the resist shape. The temperature at which this hard baking is performed varies depending on the material to be baked. Hard baking is ordinarily performed at 200 to 400° C. For example, for SU-8, a temperature of 270° C. or higher is required and thus shape fixing processing is performed at a temperature of 300° C. or higher.

Figure 3:
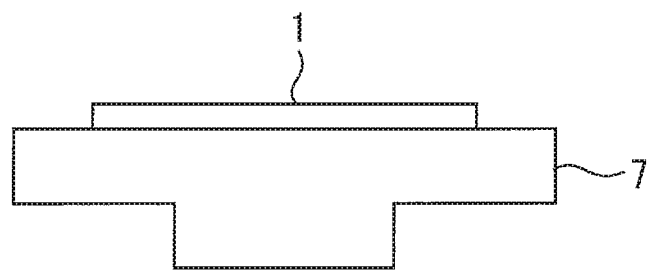
Figure 4:
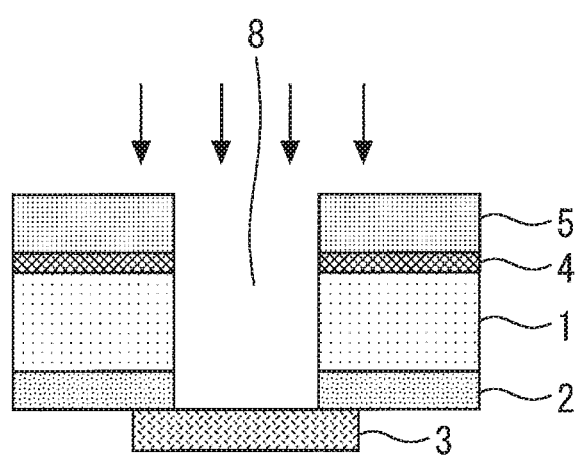

Subsequently, as shown in FIG. 3, the SiC substrate 1 in the wafer state is placed on a stage 7. The stage 7 on which the SiC substrate 1 is placed is then heated to a temperature of 200° C. or higher by a temperature control function, and the SiC substrate 1 and the GaN epi-layer 2 are dry-etched by using the patterned resist 5 as a mask. A via hole 8 is formed thereby.

Because of heating of the stage 7 to a temperature of 200° C. or higher, the reactivity of F-based processing gas used for dry etching and the SiC material is improved and the rate of processing is increased. While heating to 200° C. or higher has been described, processing may be performed at a reduced temperature of about 20° C., i.e., room temperature, in a case where processing is performed with no intention of increasing the processing rate.

Figure 5:
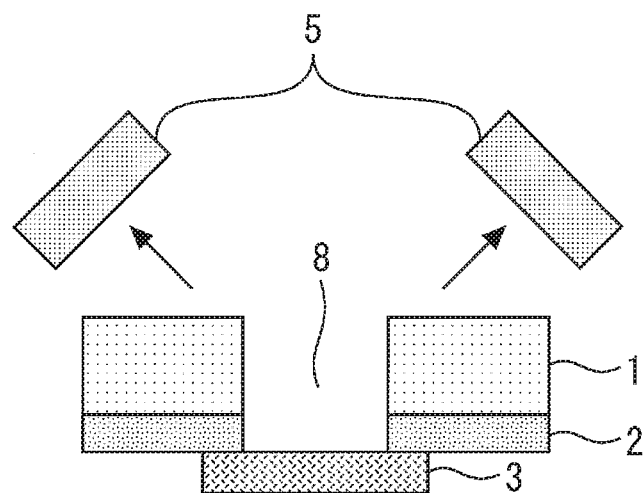

The resist 5 is cured and cannot be dissolved by an ordinary chemical solution. Then, as shown in FIG. 5, the resist separation layer 4 is removed with a chemical solution, thereby separating the resist 5 from the SiC substrate 1. In a case where the resist separation layer 4 is Omnicoat, a special chemical solution such as Remover PG is used and the substrate is immersed in the solution for about 30 to 90 min. while being maintained at an increased temperature of 50 to 80° C. In a case where the resist separation layer 4 is an aliphatic polyimide-based material, an NMP-based chemical solution such as 1165, a product from TOKYO OHKA KOGYO., LTD. is used. Plasma ashing with oxygen ($O_2$) may be performed as alternative means to remove both the resist 5 and the resist separation layer 4.

In the present embodiment, as described above, the SiC substrate 1, which is a material difficult to etch, is dry-etched by using the resist 5 as a mask instead of using a metal mask which becomes a cause of falls of debris by attaching to a ceiling plate without evaporating at the time of etching. A reduction in yield and an increase in frequency of maintenance caused by falls of debris can thereby be prevented.

Since the resist 5 is applied on the resist separation layer 4, even the resist 5 difficult to separate and dissolve in an ordinary situation can be separated from the SiC substrate 1 by removing the resist separation layer 4. Dry etching can therefore be performed at a high temperature of 200° C. or higher by using as a mask the resist 5 capable of retaining a shape at a temperature of 200° C. or higher. The processing rate is improved thereby, thus improving the productivity. Also, a conventional manufacturing apparatus can be used without being specially modified.

Second Embodiment

Figure 6:
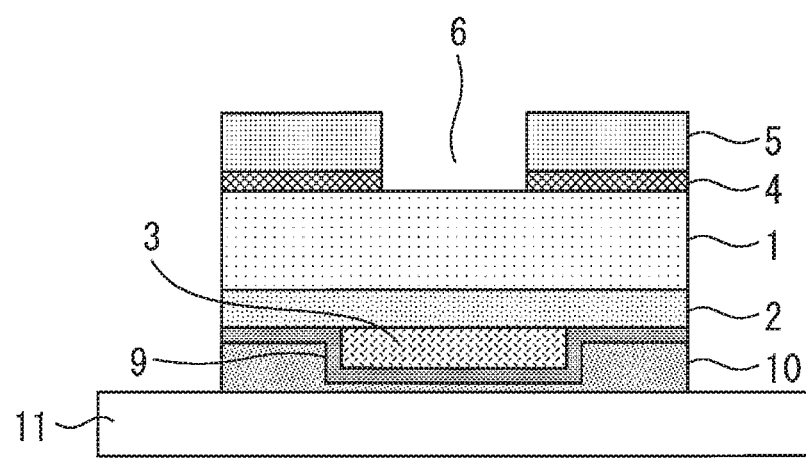
FIGS. 6 to 8 are sectional views showing a method of manufacturing a semiconductor device according to a second embodiment of the present invention.
Figure 7:
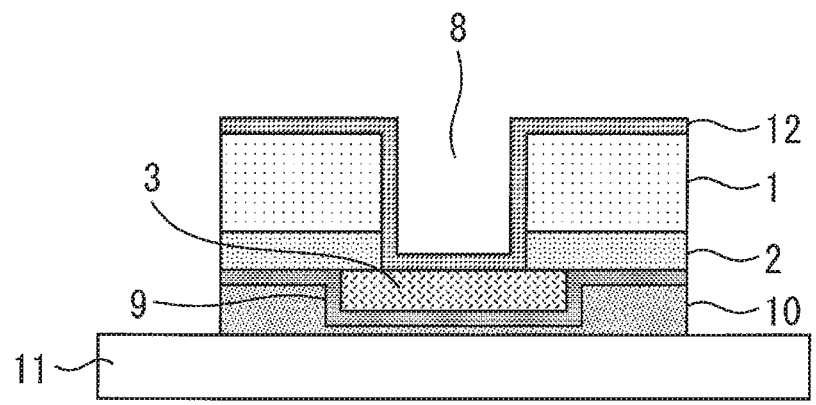
Figure 8:
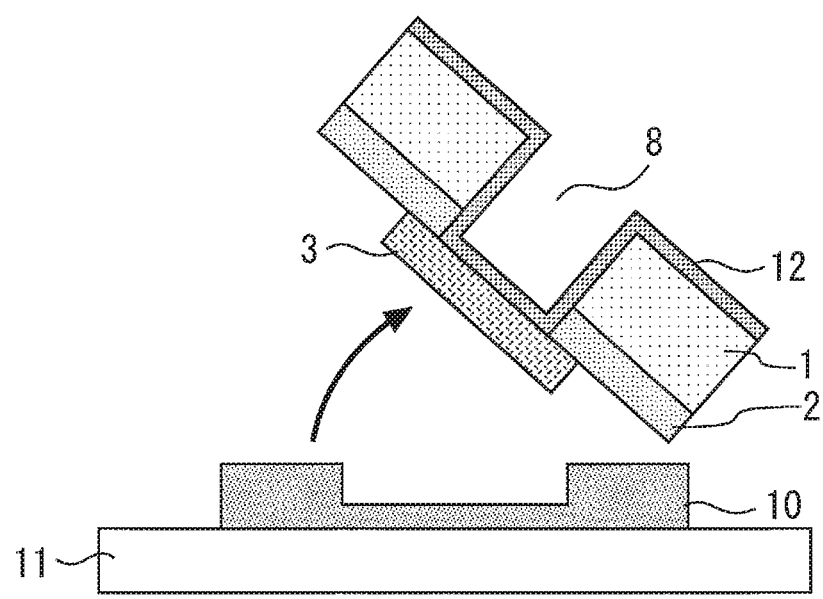

FIGS. 6 to 8 are sectional views showing a method of manufacturing a semiconductor device according to a second embodiment of the present invention. The present embodiment corresponds to a more practical mode of processing for forming a via hole in GaN-on-SiC by using a support substrate in the first embodiment.

As shown in FIG. 6, a substrate separation layer 9 is formed on the front surface side of the SiC substrate 1 on which the GaN epi-layer 2 and the source electrode 3 are formed. It is desirable to use, as the substrate separation layer 9, Omnicoat, which is an aliphatic polyimide-based resist, in order to protect the GaN epi-layer 2 and the source electrode 3 on the front surface side.

Subsequently, an adhesive 10 is applied on the substrate separation layer 9. The adhesive 10 is cured by hard baking at a temperature of 200° C. or higher, e.g., about 300° C., thereby bonding the SiC substrate 1to a support substrate 11. The adhesive 10 is a liquid material which has fluidity at temperatures of about 150 to 200° C. corresponding to the processing temperature of an attachment apparatus (degassing apparatus) but loses its fluidity after being cured at a temperature of 200 to 400° C. As the material of the adhesive 10, an epoxy permanent resist having adhesion at a temperature of 200° C. or higher, e.g., an epoxy permanent negative resist such as SU-8, Su8_3000, KI-1000 or TMMR-S2000 is used. The material of the support substrate 11 is, for example, glass, sapphire or Si and is not limited to a particular kind as long as it is larger in diameter than the SiC substrate 1 to which it is bonded.

Subsequently, the resist separation layer 4 and the resist 5 are formed, as in the first embodiment. Subsequently, the SiC substrate 1 in the wafer state, bonded to the support substrate 11, is placed on the stage 7. The stage 7 on which the SiC substrate 1 is placed is then heated to a temperature of 200° C. or higher by the temperature control function, and the SiC substrate 1 and the GaN epi-layer 2 are dry-etched by using the patterned resist 5 as a mask. Thus, the via hole 8 is formed by the same processing as that in the first embodiment. The resist 5 is thereafter separated from the SiC substrate 1, as in the first embodiment. For this separation, a removal method including use of a chemical solution is selected such that while the resist separation layer 4 is removed, the substrate separation layer 9 is not removed, thus enabling separation of the resist 5 while the SiC substrate 1 is maintained in the state of being bonded to the support substrate 11.

Subsequently, as shown in FIG. 7, a back surface electrode 12 is formed on the back surface of the SiC substrate 1 and in the via hole 8 and connected to the back surface of the source electrode 3. The back surface electrode 12, formed in the present embodiment, is not necessarily formed.

Subsequently, as shown in FIG. 8, the substrate separation layer 9 is removed with a chemical solution containing N-methyl propylene, thereby separating the SiC substrate 1 from the support substrate 11. Examples of the chemical solution containing N-methyl propylene are Remover PG and 1165.

In the present embodiment, the SiC substrate 1 is bonded to the support substrate 11 by curing the adhesive 10, and dry etching can therefore be performed at a high temperature of 200° C. or higher in the state where the SiC substrate 1 is attached to the support substrate 11, thereby achieving an improvement in processing rate and, hence, an improvement in productivity.

While the adhesive 10 is cured, the substrate separation layer 9 can be removed even when heated to a temperature of 200° C. or higher. The SiC substrate 1 can therefore be separated from the support substrate 11 by removing the substrate separation layer 9.

The method in which the SiC substrate 1 is bonded to the support substrate 11 by using the substrate separation layer 9 according to the present embodiment can also be applied in a case where a metal mask is used. However, the advantage of the first embodiment can also be obtained by combining this method with the first embodiment.

Each of the resist separation layer 4 and the substrate separation layer 9 in the first and second embodiments is an aliphatic polyimide-based resist which can be dissolved by a solvent containing N-methyl pyrrolidone even when heated to a temperature of 200° C. or higher. In particular, the process can be simplified if Omnicoat is used as the material of the resist separation layer 4, and if this material and the resist S are simultaneously patterned by photolithography. Other materials may alternatively be used. For example, a material such as SiO, SiN or Ti soluble in an acid such as buffered hydrofluoric acid (BHF) or polysilicon easily removable by dry etching using an active gas of XeF or F can be used as the materials of the resist separation layer 4 and the substrate separation layer 9.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-236851, filed on Dec. 3, 2015 including specification, claims, drawings and summary, on which the Convention priority of the present application is based, is incorporated herein by reference in its entirety.

The invention claimed is:

1. A method of manufacturing a semiconductor device comprising:
    forming a resist separation layer on a first main surface of a SiC substrate;
    applying a resist retaining a shape at a temperature of 200° C. or higher on the resist separation layer;
    patterning the resist separation layer and the resist together by a single photolithography step;
    heating a stage on which the SiC substrate is placed to a temperature of 200° C. or higher by a temperature control function, and dry-etching the SiC substrate by using the patterned resist as a mask to form a via hole; and
    after forming the via hole, removing the resist separation layer to separate the resist from the SiC substrate.

2. The method of manufacturing a semiconductor device according to claim 1, wherein the resist separation layer is a material soluble in an acid.

3. The method of manufacturing a semiconductor device according to claim 1, wherein the resist separation layer is polysilicon and removed by dry etching.

4. The method of manufacturing a semiconductor device according to claim 1, wherein the resist separation layer is an aliphatic polyimide-based resist which is dissolved by a solvent containing N-methyl pyrrolidone when heated to a temperature of 200° C. or higher.

5. The method of manufacturing a semiconductor device according to claim 1, wherein the resist is an epoxy permanent resist retaining a shape at a temperature of 200° C. or higher.

6. The method of manufacturing a semiconductor device according to claim 1, further comprising:
    before forming the resist separation layer, forming an epitaxial layer and a source electrode on the SiC substrate; and
    forming the resist separation layer on a first main surface of the SiC substrate that is opposite to the epitaxial layer and the source electrode.

7. A method of manufacturing a semiconductor device comprising:
    forming a resist separation layer on a first main surface of a SiC substrate;
    applying a resist retaining a shape at a temperature of 200° C. or higher on the resist separation layer;
    patterning the resist by photolithography;
    heating a stage on which the SiC substrate is placed to a temperature of 200° C. or higher by a temperature control function, and dry-etching the SiC substrate by using the patterned resist as a mask to form a via hole; and
    after forming the via hole, removing the resist separation layer to separate the resist from the SiC substrate, and further comprising:
    forming a substrate separation layer on a second main surface opposite to the first main surface of the SiC substrate;
    applying an adhesive on the substrate separation layer;
    bonding the SiC substrate to a support substrate by curing the adhesive at a temperature of 200° C. or higher;
    forming the via hole in the SiC substrate bonded to the support substrate; and
    after forming the via hole, removing the substrate separation layer to separate the SiC substrate from the support substrate.

8. The method of manufacturing a semiconductor device according to claim 7, wherein the substrate separation layer is a material soluble in an acid.

9. The method of manufacturing a semiconductor device according to claim 7, wherein the substrate separation layer is polysilicon and removed by dry etching.

10. The method of manufacturing a semiconductor device according to claim 7, wherein the substrate separation layer is an aliphatic polyimide-based resist which is dissolved by a solvent containing N-methyl pyrrolidone when heated to a temperature of 200° C. or higher.

11. The method of manufacturing a semiconductor device according to claim 7, wherein the adhesive is an epoxy permanent resist having adhesion at a temperature of 200° C. or higher.

12. The method of manufacturing a semiconductor device according to claim 7, further comprising:
    before forming the resist separation layer, forming an epitaxial layer and a source electrode on the SiC substrate; and
    forming the resist separation layer on a first main surface of the SiC substrate that is opposite to the epitaxial layer and the source electrode.

13. A method of manufacturing a semiconductor device comprising:
    forming a substrate separation layer on a SiC substrate;
    applying an adhesive on the substrate separation layer;
    bonding the SiC substrate to a support substrate by using the adhesive at a temperature of 200° C. or higher;
    heating a stage on which the SiC substrate bonded to the support substrate is placed to a temperature of 200° C. or higher by a temperature control function, and dry-etching the SiC substrate to form a via hole; and after forming the via hole, removing the substrate separation layer to separate the SiC substrate from the support substrate.

14. The method of manufacturing a semiconductor device according to claim 13, wherein the substrate separation layer is a material soluble in an acid.

15. The method of manufacturing a semiconductor device according to claim 13, wherein the substrate separation layer is polysilicon and removed by dry etching.

16. The method of manufacturing a semiconductor device according to claim 13, wherein the substrate separation layer is an aliphatic polyimide-based resist which is dissolved by a solvent containing N-methyl pyrrolidone when heated to a temperature of 200° C. or higher.

17. The method of manufacturing a semiconductor device according to claim 13, wherein the adhesive is an epoxy permanent resist having adhesion at a temperature of 200 ° C. or higher.

* * * * *